United States Patent
Jen et al.

(10) Patent No.: US 7,411,213 B2
(45) Date of Patent: Aug. 12, 2008

(54) PIXEL STRUCTURE, THIN FILM TRANSISTOR ARRAY SUBSTRATE AND LIQUID CRYSTAL DISPLAY PANEL

(75) Inventors: Chien-Chih Jen, Taipei (TW); Ming-Zen Wu, Renwu Township, Kaohsiung County (TW)

(73) Assignee: Chunghwa Picture Tubes, Ltd., Taipei (TW)

(*) Notice: Subject to any disclaimer, the term of this patent is extended or adjusted under 35 U.S.C. 154(b) by 0 days.

(21) Appl. No.: 11/397,492

(22) Filed: Apr. 3, 2006

(65) Prior Publication Data

US 2007/0228466 A1    Oct. 4, 2007

(51) Int. Cl.
*H01L 29/04* (2006.01)
*H01L 29/10* (2006.01)
*H01L 31/00* (2006.01)

(52) U.S. Cl. ......................... 257/59; 257/72
(58) Field of Classification Search .............. 257/59, 257/72, 79, 88, E29.151, E51.005; 438/22, 438/24, 46, 47, 48, 128, 149, 151, 157, 283
See application file for complete search history.

(56) References Cited

U.S. PATENT DOCUMENTS

| | | | | |
|---|---|---|---|---|
| 5,879,959 A * | 3/1999 | Chen | | 438/30 |
| 5,953,583 A * | 9/1999 | Ban et al. | | 438/30 |
| 6,340,830 B1 * | 1/2002 | Takemura | | 257/350 |
| 6,562,645 B2 * | 5/2003 | Sung et al. | | 438/30 |
| 6,765,270 B2 * | 7/2004 | Chae | | 257/390 |
| 7,176,535 B2 * | 2/2007 | Chae | | 257/390 |
| 2001/0041394 A1 * | 11/2001 | Park et al. | | 438/151 |
| 2002/0048861 A1 * | 4/2002 | Seo | | 438/149 |
| 2002/0158829 A1 * | 10/2002 | Yamazaki et al. | | 345/92 |
| 2002/0197760 A1 * | 12/2002 | Yamazaki et al. | | 438/48 |
| 2004/0043545 A1 * | 3/2004 | Yoo et al. | | 438/149 |
| 2004/0166613 A1 * | 8/2004 | Shih | | 438/149 |
| 2004/0191968 A1 * | 9/2004 | Yang | | 438/151 |
| 2004/0209407 A1 * | 10/2004 | Chae | | 438/149 |
| 2005/0041169 A1 | 2/2005 | Hashimoto et al. | | 349/43 |
| 2006/0099526 A1 * | 5/2006 | Yang | | 430/58.5 |

* cited by examiner

*Primary Examiner*—Jerome Jackson
*Assistant Examiner*—Anthony Ho
(74) *Attorney, Agent, or Firm*—J.C. Patents

(57) ABSTRACT

A pixel structure, suitable being driven by a scan line and a data line on a substrate, is provided. The pixel structure includes a thin film transistor (TFT) and a pixel electrode. Wherein, the TFT includes a gate, a first and a second dielectric layer, a semiconductor layer, a source, and a drain. Especially, the semiconductor layer has a body part and at least one extending part connected to thereof. The extending part is protruded from the edge of the body part disposed between the source and the drain. In addition, at least one contact hole is disposed in the second dielectric layer for exposing the extending part, and the first dielectric layer, the semiconductor layer, and the second dielectric layer at the extending part are removed through the contact hole. So, leakage current can be effectively reduced, thereby raising the Ion/Ioff ratio of the pixel structure.

18 Claims, 7 Drawing Sheets

US 7,411,213 B2

PIXEL STRUCTURE, THIN FILM TRANSISTOR ARRAY SUBSTRATE AND LIQUID CRYSTAL DISPLAY PANEL

BACKGROUND OF THE INVENTION

1. Field of Invention

The present invention relates to a pixel structure. More particularly, the present invention relates to a pixel structure capable of raising the ratio of on-state/off-state current (Ion/Ioff) effectively.

2. Description of Related Art

Thanks to the progress of semiconductor elements and display devices, multimedia technology has been highly developed and adopted nowadays. For display devices, thin film transistor liquid crystal display (TFT-LCD), having the advantages of high picture quality, excellent space utilization, low power consumption, non-radiation, etc., has gradually become the mainstream in the market.

An ordinary TFT-LCD mainly includes a thin film transistor array substrate (TFT array substrate), a color filter substrate, and a liquid crystal layer disposed between the above two substrates. The TFT array substrate is constituted by a substrate, TFTs and pixel electrodes arranged on the substrate in an array, scan lines, and data lines. In general, the scan line and the data line can transmit signals to the corresponding TFT for the purpose of displaying.

In LCDs of high resolution and high vertical scan frequency, the TFT array should meet the demand of a high Ion/Ioff ratio. Generally, only when the Ion/Ioff ratio is not less than $10^5$, can the TFT-LCD provide a preferable display quality.

In view of the above, there are two methods for increasing the Ion/Ioff ratio in the prior art: (1) increasing the on-state current (Ion); (2) reducing the off-state current (Ioff). According to the first method, the on-state current is set by adjusting the ratio of width/length of channel (W/L of channel) of TFT. However, if the width of channel of TFT is continuously enlarged, a large gate-drain parasitic capacitance (Cgd) and kick-back voltage may be generated, thus causing the problem of flickering and affecting the display quality.

The second method is employed by reducing the off-state current, which does not have the above-described disadvantages. In other words, the leakage current phenomenon occurred in the TFT can be reduced and the Ion/Ioff ratio can be effectively increased without causing a large Cgd and kick-back voltage. It should be noted that the aforementioned leakage current phenomenon is mainly caused by a non-completely etched ohmic contact layer in the semiconductor layer.

FIG. 1 is a schematic top view of a conventional pixel structure. FIG. 1A is a schematic sectional view along the line A-A' of FIG. 1. Referring to FIGS. 1 and 1A, the pixel structure 300 includes a TFT 100 and a pixel electrode 200, and the TFT 100 is driven by the scan line 170 and the data line 180 on the substrate 160. The TFT 100 includes a gate 110, a gate insulation layer 120, a semiconductor layer 130, a source 140a, a drain 140b, and a protection layer 150. The gate 110 is electrically connected to the scan line 170. The gate insulation layer 120 covers the gate 110 and the scan line 170. The semiconductor layer 130 is disposed on the gate insulation layer 120 over the gate 110, and the semiconductor layer 130 is composed of a channel layer 130a and an ohmic contact layer 130b. The source 140a and the drain 140b are disposed on the semiconductor layer 130, and the source 140a is electrically connected to the data line 180. The protection layer 150 covers the source 140a and the drain 140b, and a contact hole 150a is disposed therein for exposing the drain 140b. The pixel electrode 200 is electrically connected to the drain 140b of the TFT 100.

Referring to FIG. 1A again, an ordinary TFT process often employs a photoresist layer (not shown), the source 140a, and the drain 140b as an etching mask to remove the ohmic contact layer 130b above the gate 110, i.e., the TFT 100 is fabricated by back channel etching (BCE). However, when the method is used in fabricating a large-sized panel, as the uniformity of the overall etching speed differs, a part of the ohmic contact layer 130b may be left near the region 190 as shown in FIG. 1 or FIG. 1A. As the ohmic contact layer 130b has a good conductive property, the leakage current may occur along the path A as shown in FIG. 1. Therefore, the pixel electrode 200 cannot keep the data voltage applied thereto, thus causing poor display quality such as flickering or cross talk.

There are three conventional methods for reducing the above-mentioned leakage current phenomenon. The first method increases the interlayer distance between the semiconductor layer 130, the source 140a, and the drain 140b. Referring to FIG. 2, the second method enlarges the width w of the cutout 195 of the semiconductor layer 130 between the source 140a and the drain 140b, such that the leakage current cannot be circulated in the path B easily. However, the above two methods may increase the load capacitance of the circuit and reduce the aperture ratio of the pixel structure 300, thus causing distortion or flickering of the driving signal.

Referring to FIG. 3, the third method increases the distance between the source 140a and the drain 140b at the edge, which is disclosed by U.S. No. 20050041169. As shown in FIG. 3, the distance between the source 140a and the drain 140b is L1 (i.e., length of the channel), and the distance between the edges of source 140a and the drain 140b is L2. That is to say, the distance between the source 140a and the drain 140b at the edge is increased by ΔL, and the width is changed by Δw. Therefore, by this design, the occurrence of leakage current can be reduced without decreasing the on-state current. However, the design can neither be used to reduce the leakage current phenomenon caused by the non-uniform dry etching of the ohmic contact layer 130b, nor to raise the Ion/Ioff ratio to the required level.

SUMMARY OF THE INVENTION

An object of the invention is to provide a pixel structure, for effectively reducing the leakage current caused by the non-uniform dry etching of the ohmic contact layer, and further for raising the Ion/Ioff ratio.

Another object of the invention is to provide a TFT array substrate, which has the foregoing pixel structure, and can effectively reduce the leakage current caused by the non-uniform dry etching of the ohmic contact layer, and further raise the Ion/Ioff ratio.

Yet another object of the invention is to provide a liquid crystal display panel, which has the foregoing TFT array substrate, for reducing poor display quality such as flickering and cross talk.

To achieve the above or other objects, the invention provides a pixel structure driven by the scan and data lines on the substrate. The pixel structure includes a TFT and a pixel electrode. The TFT includes a gate, a first dielectric layer, a semiconductor layer, a source, a drain, and a second dielectric layer. The gate is electrically connected to the scan line. The first dielectric layer covers the gate and the scan line. The semiconductor layer is disposed on the first dielectric layer above the gate, wherein the semiconductor layer has a body part and at least one extending part connected to the body part. The source and the drain are disposed on the semiconductor layer, and the source is electrically connected to the data line. The extending part is protruded from the edge of the body part disposed between the source and the drain. The second dielectric layer covers the source and the drain, and at least one contact hole is disposed therein for exposing the extending part and the drain. The pixel electrode is electrically connected to the drain of the TFT.

To achieve the above or other objects, the invention further provides a TFT array substrate, which includes a substrate, multiple scan lines, multiple data lines, and multiple pixel structures. The scan and data lines are disposed on the substrate. The pixel structures are electrically connected to the corresponding scan and data lines, and every pixel structure includes a TFT and a pixel electrode. The TFT includes a gate, a first dielectric layer, a semiconductor layer, a source, a drain, and a second dielectric layer. The gate is electrically connected to the scan line. The first dielectric layer covers the gate and the scan line. The semiconductor layer is disposed on the first dielectric layer above the gate, wherein the semiconductor layer has a body part and at least one extending part connected to the body part. The source and the drain are disposed on the semiconductor layer, and the source is electrically connected to the data line. The extending part is protruded from the edge of the body part disposed between the source and the drain. The second dielectric layer covers the source and the drain, and at least one contact hole is disposed therein for exposing the extending part and the drain. The pixel electrode is electrically connected to the drain of the TFT.

To achieve the above and other objects, the invention further provides a liquid crystal display panel, which includes an aforementioned TFT array substrate, a color filter substrate, and a liquid crystal layer disposed between the TFT array substrate and the color filter substrate.

In one embodiment, the aforementioned contact hole exposes the end of the extending part. And the first dielectric layer, the semiconductor layer, and the second dielectric layer at the end of the extending part are removed through the contact hole.

In one embodiment, the aforementioned contact hole exposes the middle part of the extending part. And the first dielectric layer, the semiconductor layer, and the second dielectric layer in the middle of the extending part are removed through the contact hole.

In one embodiment, the extending direction of the aforementioned extending part is perpendicular to the scan line, and the extending part is protruded out of the scan line.

In one embodiment, the aforementioned extending part includes a first extending part and a second extending part, wherein the first extending part extends in a first direction perpendicular to the scan line and is protruded out of the scan line. The second extending part extends in a second direction perpendicular to the scan line and is protruded out of the scan line.

In one embodiment, the aforementioned semiconductor layer includes a channel layer and an ohmic contact layer disposed on the channel layer.

In the invention, the semiconductor layer of the pixel structure includes a body part and an extending part, and the extending part is protruded out of the scan line. Moreover, the ohmic contact layer, the channel layer, and the first dielectric layer in the extending part are removed when forming a contact hole in the second dielectric layer above the extending part. As such, leakage current caused by the non-uniform dry etching of the ohmic contact layer can be effectively reduced, thereby raising the Ion/Ioff ratio of the pixel structure. Besides, the resolution and the vertical scan frequency of the TFT array substrate and liquid crystal display panel can be improved by adopting the pixel structure; poor display such as flickering and cross talk can also be reduced.

In order to the make the aforementioned and other objects, features and advantages of the present invention comprehensible, preferred embodiments accompanied with figures is described in detail below.

DESCRIPTION OF EMBODIMENTS

Figure 1:
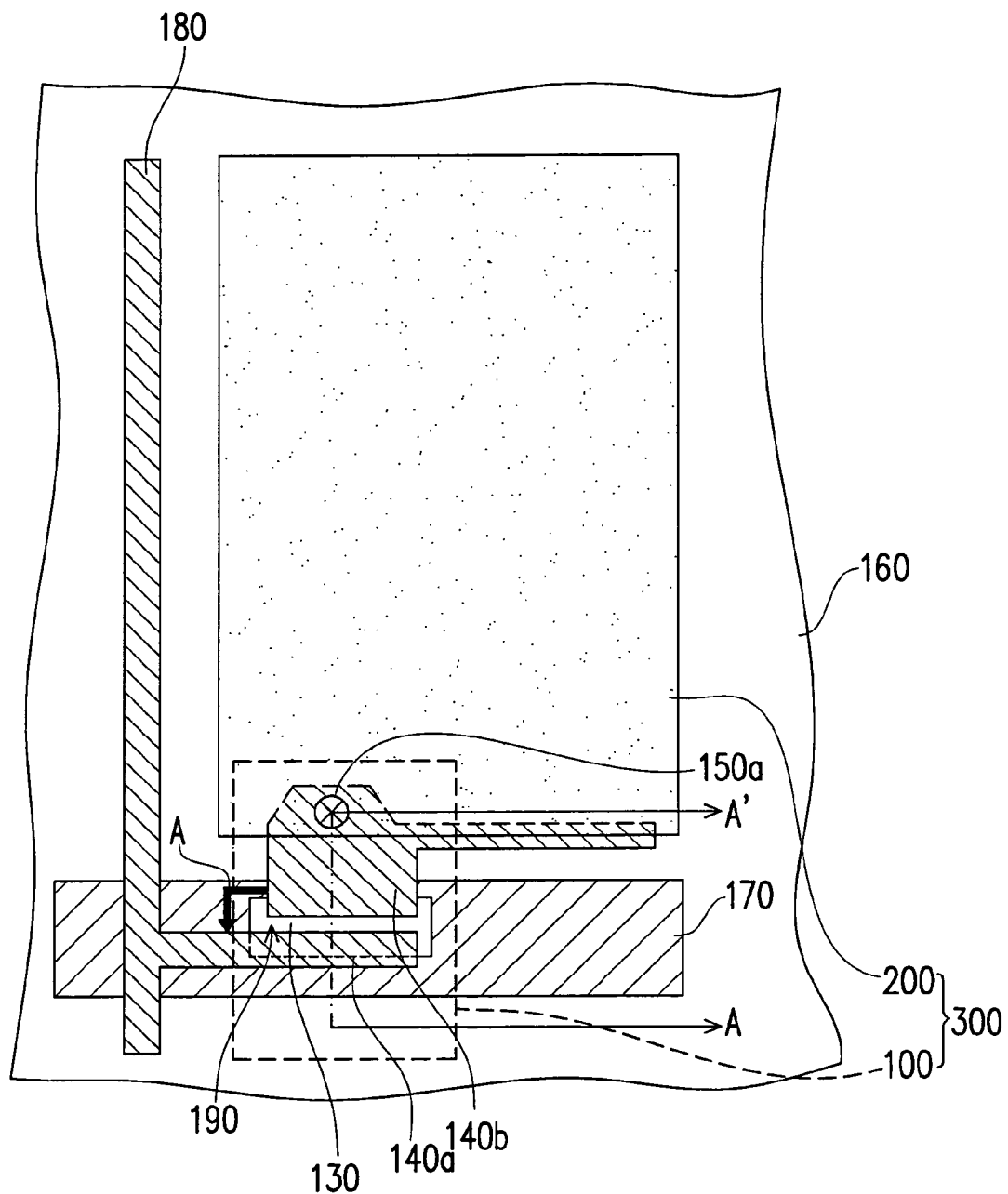
FIG. 1 depicts a schematic top view of a conventional pixel structure.
Figure 1A:
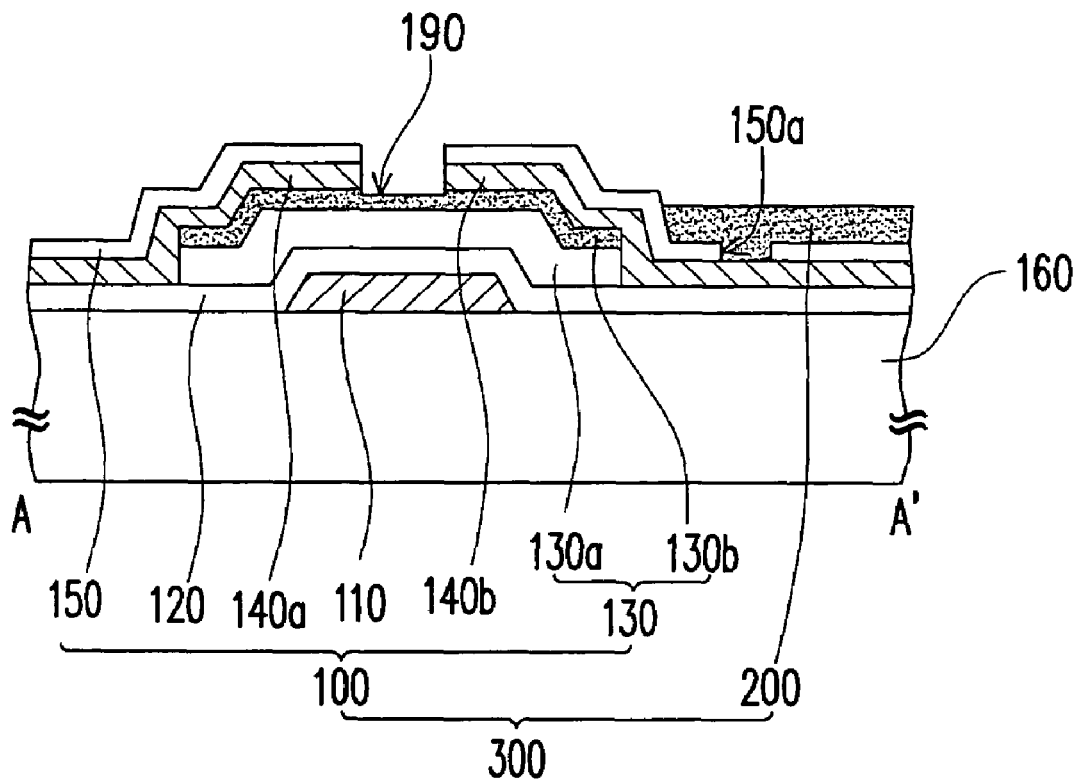
FIG. 1A depicts a schematic sectional view along the line A-A' of FIG. 1.
Figure 2:
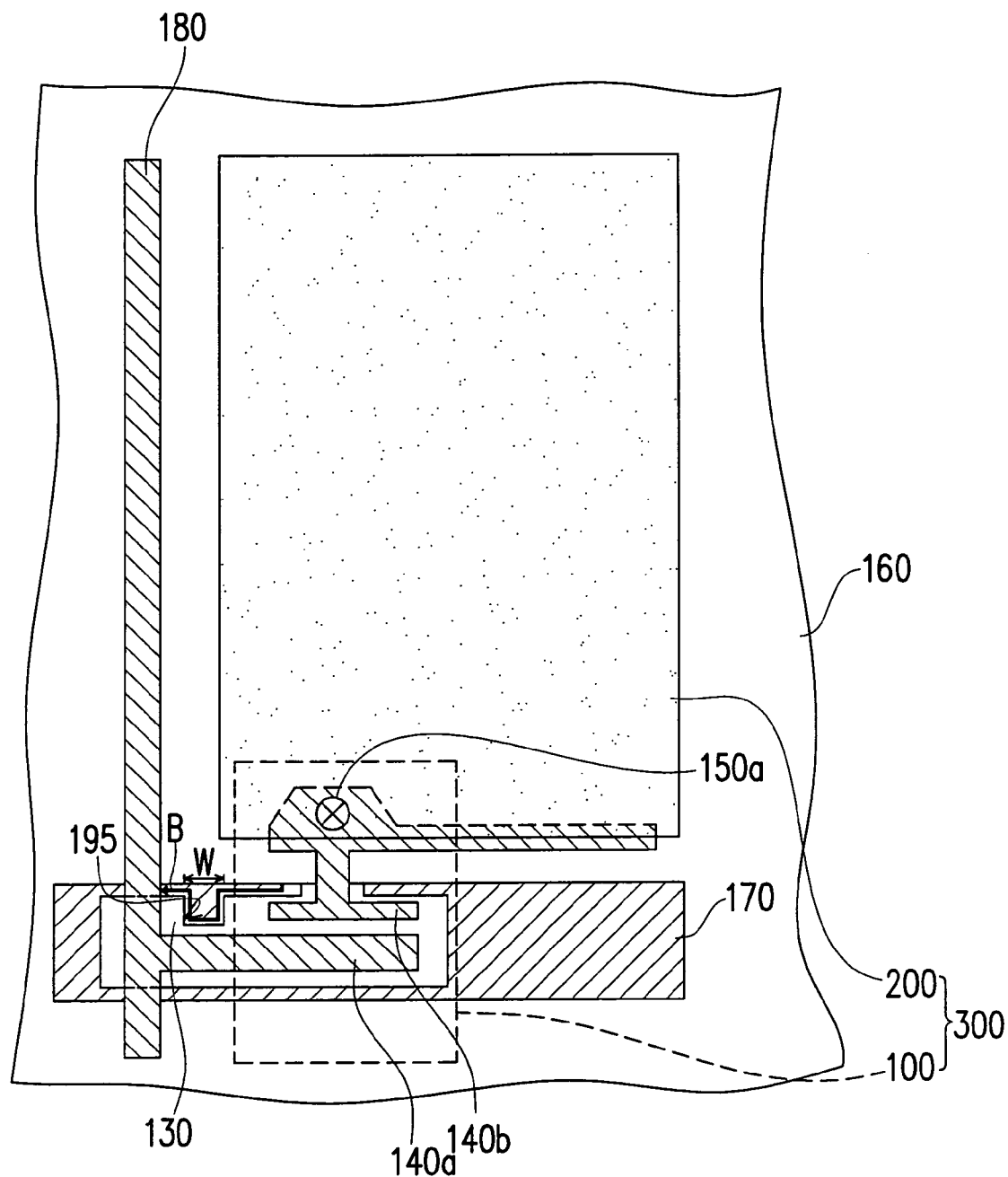
FIG. 2 depicts a schematic top view of another conventional pixel structure.
Figure 3:
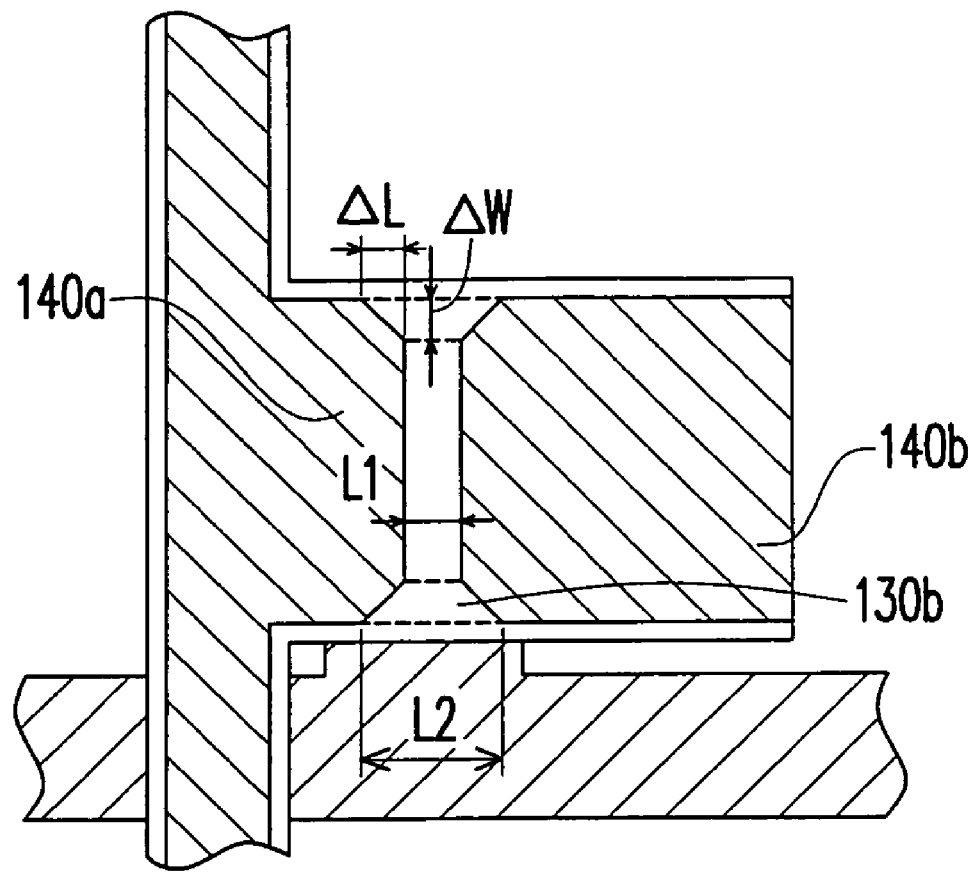
FIG. 3 depicts a schematic top view of a conventional TFT.
Figure 4:
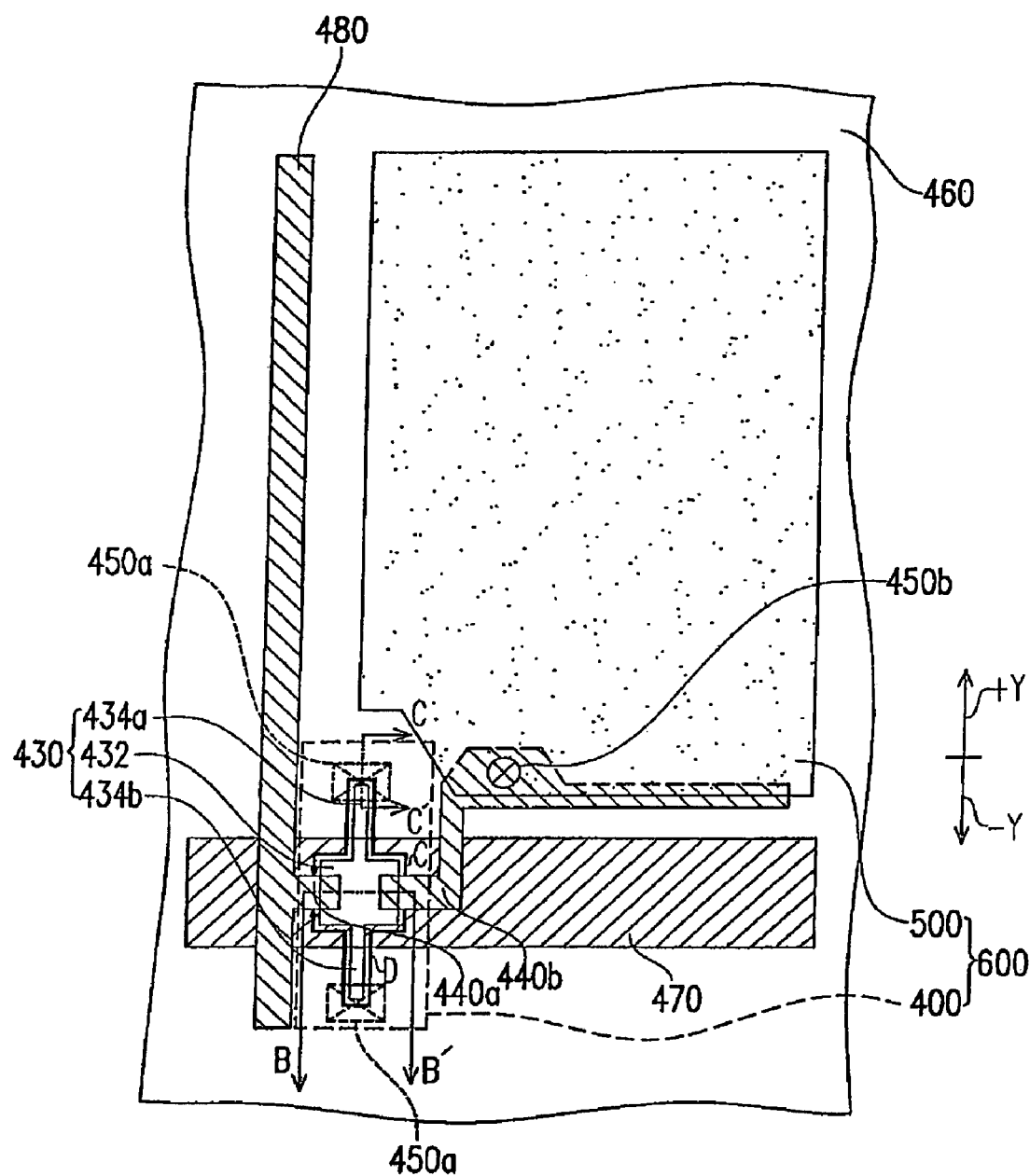
FIG. 4 depicts a schematic view of the pixel structure according to the preferred embodiment of the invention.
Figure 4A:
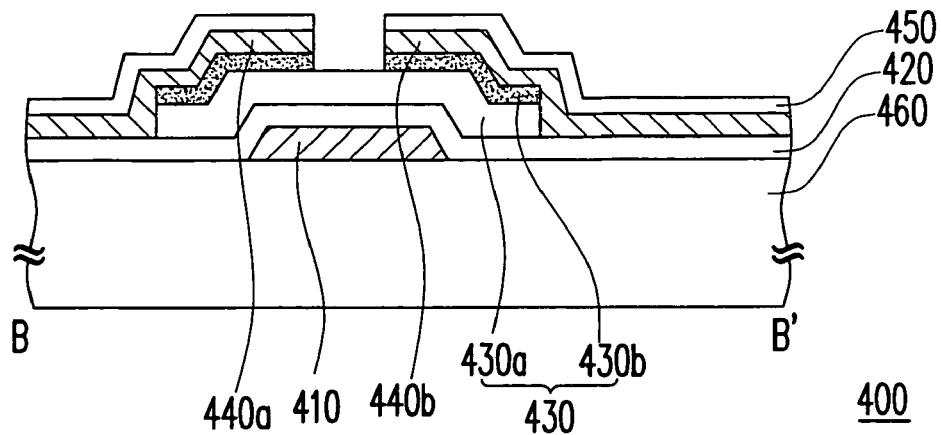
FIG. 4A depicts a schematic sectional view along the line B-B' of FIG. 4.
Figure 4B:
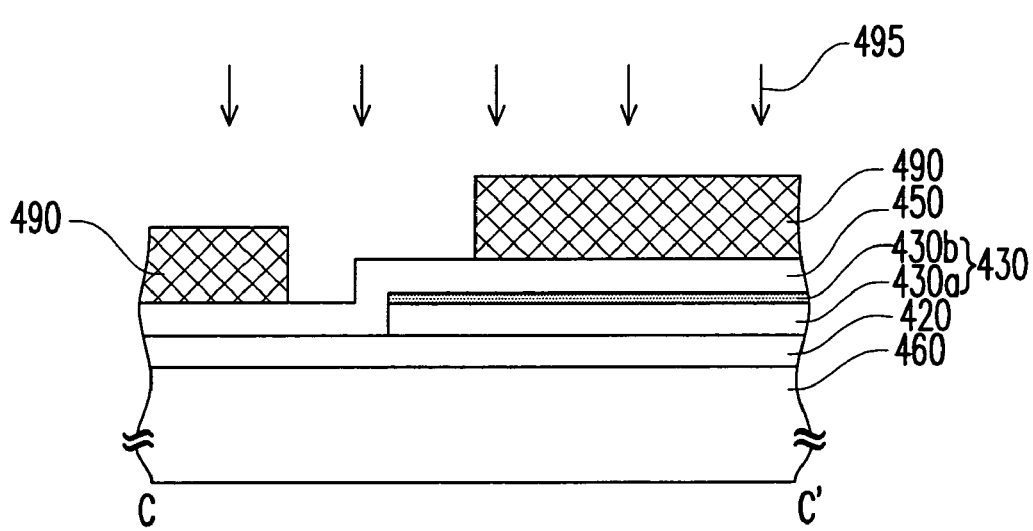
FIGS. 4B and 4C depict schematic sectional views along the line C-C' of FIG. 4.
Figure 4C:
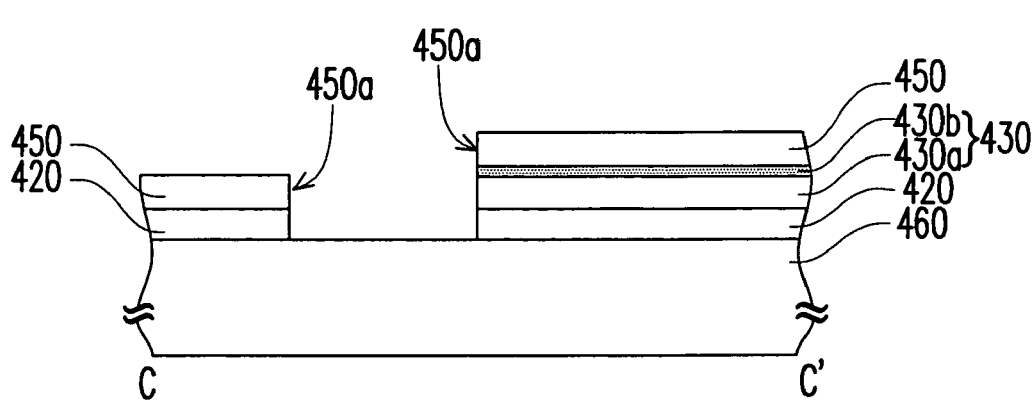

FIG. 4 is a schematic sectional view of a pixel structure according to the preferred embodiment of the invention. FIG. 4A is a schematic sectional view along the line B-B' of FIG. 4. FIGS. 4B and 4C are schematic sectional views along the line C-C' of FIG. 4.

Referring to FIGS. 4 and 4A first, the pixel structure 600 is driven by the scan line 470 and the data line 480 on the substrate 460. The pixel structure 600 includes a TFT 400 and a pixel electrode 500. The TFT 400 includes a gate 410, a first dielectric layer 420, a semiconductor layer 430, a source 440a, a drain 440b, and a second dielectric layer 450.

The gate 410 is electrically connected to the scan line 470. The first dielectric layer 420 covers the gate 410 and the scan line 470. The semiconductor layer 430 is disposed on the first dielectric layer 420 above the gate 410, wherein the semiconductor layer 430 has a body part 432 and at least one extending part 434a or 434b connected to the body part 432. The source 440a and the drain 440b are disposed on the semiconductor layer 430, and the source 440a is electrically connected to the data line 480. The extending parts 434a, 434b are protruded from the edge of the body part 432 disposed between the source 440a and the drain 440b. The second dielectric layer 450 covers the source 440a and the drain 440b, and at least one hole 450a is disposed therein for exposing the extending parts 434a, 434b, and a contact hole 450b is disposed in the second dielectric layer 450 to expose the drain 440b. The pixel electrode 500 is electrically connected to the drain 440b of the TFT 400 through the contact hole 450b.

In one embodiment, the scan line 470 is used as the gate 410, and the TFT 400 is directly fabricated on the scan line 470. However, in another embodiment, a gate pattern (not shown) can be fabricated additionally, and the TFT (not shown) is fabricated on the gate pattern, wherein the gate pattern and the scan line 470 are electrically connected to each other. The gate 410 and the scan line 470 form the first metal layer (metal 1).

The first dielectric layer 420 covers the gate 410 and the scan line 470. The material of the first dielectric layer 420 can be silicon dioxide, silicon nitride, or silicon oxynitride, and the method for forming the first dielectric layer 420 can be, for example, chemical vapor deposition (CVD).

The semiconductor layer 430 can be a film layer consisting of a channel layer 430a and an ohmic contact layer 430b disposed on the channel layer 430a. The material of the channel layer 430a can be amorphous silicon (αSi), while the material of the ohmic contact layer 430b can be doped amorphous silicon (n$^+$αSi). Particularly, the semiconductor layer 430 is, for example, a pattern having the body part 432 and at least one extending part 434a, 434b. The extending direction of the extending parts 434a, 434b is perpendicular to the scan line 470 and the extending parts 434a, 434b are protruded out of the scan line 470.

In particular, the two extending parts depicted in FIG. 4 include a first extending part 434a and a second extending part 434b. The first extending part 434a extends in a first direction +Y perpendicular to the scan line 470 and is protruded out of the scan line 470. The second extending part 434b extends in a second direction −Y perpendicular to the scan line 470 and is protruded out of the scan line 470. The advantage of disposing the extending part will be illustrated hereinafter.

The source 440a and the drain 440b are disposed on the body part 432 of the semiconductor layer 430. The source 440a, the drain 440b, and the data line 480 form the second metal layer (metal 2). The pixel electrode 500 is electrically connected to the drain 440b of the TFT 400. In one embodiment, the material of the pixel electrode 500 can be transparent conductive materials, for example, indium tin oxide (ITO) or indium zinc oxide (IZO).

The advantage of disposing an extending part is illustrated as follows. Referring to FIGS. 4 and 4A, when the scan line 470 applies proper voltage to the TFT 400, the TFT 400 is turned on for transmitting the data voltage applied to the source 440a by the data line 480 to the pixel electrode 500. However, as the non-completely etched ohmic contact layer 430b exists at the periphery of the semiconductor layer 430, the data voltage applied to the pixel electrode 500 can hardly be kept stable, thereby causing leakage current along the path C or D.

Therefore, in the invention, the ohmic contact layer 430b at the end of or in the middle of the extending parts 434a, 434b is removed by etching the foregoing extending parts 434a, 434b, so as to reduce the leakage current phenomenon occurred in the TFT 400.

Referring to FIGS. 4, 4B, and 4C, at least one hole 450a is disposed above the extending parts 434a, 434b. In one embodiment, the hole 450a exposes the end of the extending parts 434a, 434b; and the first dielectric layer 420, the semiconductor layer 430, and the second dielectric layer 450 at the end of the extending parts 434a, 434b are removed through the hole 450a.

In another embodiment, the hole 450a exposes the middle part of the extending parts 434a, 434b (not shown); and the first dielectric layer 420, the semiconductor layer 430, and the second dielectric layer 450 in the middle of the extending parts 434a, 434b are removed through the hole 450a.

In particular, in one embodiment, a part of the second dielectric layer 450 can be removed by the photoresist layer 490 and the etching process 495 in FIG. 4B to form the hole 450a in FIG. 4C. Meanwhile, the ohmic contact layer 430b and the channel layer 430a exposed by the hole 450a are also removed. Therefore, the ohmic contact layer 430b at the end of or in the middle of the extending parts 434a, 434b can be completely removed. That is to say, the leakage current caused by the ohmic contact layer 430b along the paths C and D can be blocked at the position where the hole 450a is disposed. As such, even if the ohmic contact layer 430b exists at both sides of or at the periphery of the TFT 400, overleakage current will not happen. Therefore, the TFT 400 can effectively reduce the off-state current (Ioff), and raise the Ion/Ioff ratio.

In one embodiment, the gas used in the etching process 495 is a mixture of $SF_6$ and $CH_4$, and the etching selection rate of amorphous silicon/silicon nitride ($\alpha$-Si/SiN$_x$) is not less than 1:3-1:5. Therefore, through the etching process 495, the ohmic contact layer 430b and the channel layer 430a can be removed effectively.

Furthermore, as the extending parts 434a, 434b are not disposed on the scan line 470 or the data line 480, the load capacitance of the circuit will not rise. Besides, the arrangement of the extending parts 434a, 434b will not affect the aperture ratio of the pixel structure 600, but light can transmit the pixel structure 600 effectively. Moreover, the process of removing the ohmic contact layer 430b when forming the contact hole 450a is very simple and will not add extra cost.

In view of the above, the pixel structure 600 according to the invention can reduce the leakage current phenomenon along the paths C and D caused by the ohmic contact layer 430b without increasing the load capacitance of the circuit as well as the aperture ratio of the pixel. Therefore, the pixel structure 600 can effectively reduce the Ioff and raise the Ion/Ioff ratio.

Figure 5:
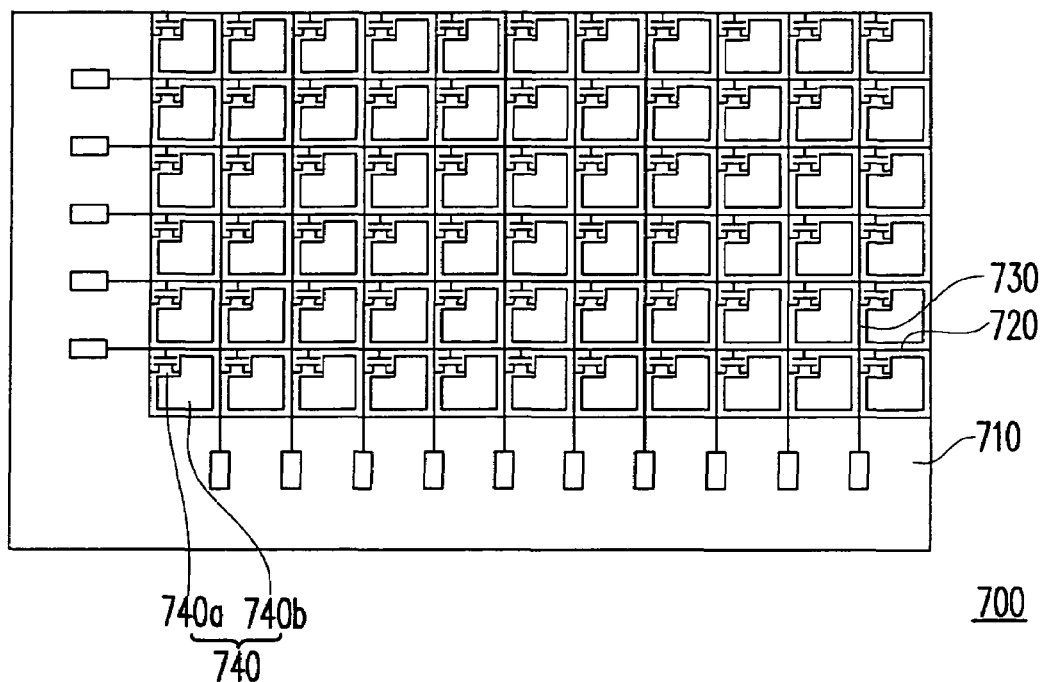
FIG. 5 depicts a schematic view of the TFT array substrate according to the preferred embodiment of the invention.

FIG. 5 is a schematic view of a TFT array substrate according to the preferred embodiment of the invention. Referring to FIG. 5, the TFT array substrate 700 includes a substrate 710, multiple scan lines 720, multiple data lines 730, and multiple pixel structures 740, wherein the scan lines 720 and the data lines 730 are disposed on the substrate 710. The pixel structures 740 are electrically connected to the corresponding scan lines 720 and data lines 730.

It should be noted that the elements of each pixel structure 740 are all identical with that of pixel structure 600, and will not be repeated herein. As the semiconductor layer (not shown) of the TFT 740a has an extending part (not shown), and the ohmic contact layer (not shown) at the end or in the middle of the extending part is removed by etching when the contact hole (not shown) is formed, the leakage current phenomenon caused by the non-complete etching of the ohmic contact layer can be reduced, thereby effectively reducing the Ioff and raising the Ion/Ioff ratio. Therefore, the data voltage on the pixel electrode 740b can be kept stable.

Figure 6:
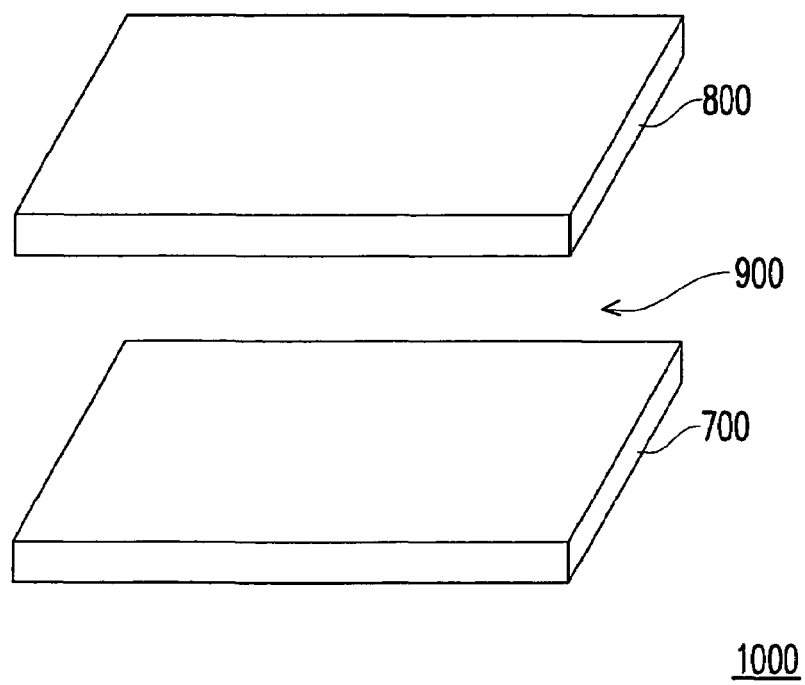
FIG. 6 depicts a schematic dimensional view of the liquid crystal display panel according to the preferred embodiment of the invention.

FIG. 6 is a schematic dimensional view of a liquid crystal display panel according to the preferred embodiment of the invention. The liquid crystal display panel 1000 includes an aforementioned TFT array substrate 700, a color filter substrate 800, and a liquid crystal layer 900 located between the TFT array substrate 700 and the color filter substrate 800. As the liquid crystal display panel 1000 has the above-mentioned TFT array substrate 700 of a high Ion/Ioff ratio, poor display phenomena such as flickering and cross talk can be reduced and the display quality is thereby improved.

To sum up, the pixel structure, the TFT array substrate, and the liquid crystal display panel have the advantages as follows.

(1) The pixel structure can effectively reduce the leakage current phenomenon caused by the ohmic contact layer. Therefore, the Ioff can be reduced and the Ion/Ioff ratio of the pixel structure can be raised.

(2) The invention employs a layout of mask to form a semiconductor layer having a body part and an extending part. The ohmic contact layer in the extending part can be removed when the contact hole is formed. As such, the leakage current phenomenon can be reduced. Thus, the process of the invention is very simple.

(3) By applying the pixel structure of a high Ion/Ioff ratio to a TFT array substrate and a liquid crystal display panel, the resolution and the vertical scan frequency of the TFT array substrate can be improved and poor display phenomena such as flickering and cross talk of the liquid crystal display panel can be reduced.

Though the present invention has been disclosed above by the preferred embodiments, it is not intended to limit the invention. Anybody skilled in the art can make some modifications and variations without departing from the spirit and scope of the invention. Therefore, the protecting range of the invention falls in the appended claims.

What is claimed is:

1. A pixel structure driven by a scan line and a data line on a substrate, comprising:
    a TFT, including:
        a gate, electrically connected to the scan line;
        a first dielectric layer, covering the gate and the scan line;
        a semiconductor layer, disposed on the first dielectric layer above the gate, wherein the semiconductor layer has a body part and at least one extending part connected to the body part;
        a source and a drain, disposed on the semiconductor layer, wherein the source is electrically connected to the data line, and the extending part is protruded from the edge of the body part between the source and the drain;
        a second dielectric layer, covering the source and the drain; wherein at least a hole is disposed in and passes through the second dielectric layer, a portion of the extending part of the semiconductor layer, and the first dielectric layer; and
    a pixel electrode, electrically connected to the drain of the TFT.

2. The pixel structure according to claim 1, wherein the hole passes through the end of the extending part.

3. The pixel structure according to claim 1, wherein the hole passes through the middle part of the extending part.

4. The pixel structure according to claim 1, wherein the extending direction of the extending part is perpendicular to the scan line, and the extending part is protruded out of the scan line.

5. The pixel structure according to claim 4, wherein the extending part comprises:
    a first extending part, extending in a first direction perpendicular to the scan line, and protruded out of the scan line; and
    a second extending part, extending in a second direction perpendicular to the scan line, and protruded out of the scan line.

6. The pixel structure according to claim 1, wherein the semiconductor layer comprises a channel layer and an ohmic contact layer disposed on the channel layer.

7. A TFT array substrate, comprising:
    a substrate;
    a plurality of scan lines and multiple data lines, disposed on the substrate;
    a plurality of pixel structures, electrically connected to the corresponding scan lines and data lines, and each pixel structure including:
        a TFT, having:
            a gate, electrically connected to the scan line;
            a first dielectric layer, covering the gate and the scan line;
            a semiconductor layer, disposed on the first dielectric layer above the gate, wherein the semiconductor layer has a body part and at least one extending part connected to the body part;
            a source and a drain, disposed on the semiconductor layer, wherein the source is electrically connected to the data line, and the extending part is protruded from the edge of the body part between the source and the drain;
            a second dielectric layer, covering the source and the drain; wherein at least a hole is disposed in and passes through the second dielectric layer, a portion of the extending part of the extending part of the semiconductor layer, and the first dielectric layer; and
        a pixel electrode, electrically connected to the drain of the TFT.

8. The TFT array substrate according to claim 7, wherein the hole passes through the end of the extending part.

9. The TFT array substrate according to claim 7, wherein the hole passes through the middle part of the extending part.

10. The TFT array substrate according to claim 7, wherein the extending direction of the extending part is perpendicular to the scan line, and the extending part is protruded out of the scan line.

11. The TFT array substrate according to claim 10, wherein the extending part comprises:
    a first extending part, extending in a first direction perpendicular to the scan line, and protruded out of the scan line; and
    a second extending part, extending in a second direction perpendicular to the scan line, and protruded out of the scan line.

12. The TFT array substrate according to claim 7, wherein the semiconductor layer comprises a channel layer and an ohmic contact layer disposed on the channel layer.

13. A liquid crystal display panel, comprising:
    a TFT array substrate according to claim 7;
    a color filter substrate; and
    a liquid crystal layer, disposed between the TFT array substrate and the color filter substrate.

14. The liquid crystal display panel according to claim 13, wherein the hole passes through the end of the extending part.

15. The liquid crystal display panel according to claim 13, wherein the hole passes through the middle part of the extending part.

16. The liquid crystal display panel according to claim 13, wherein the extending direction of the extending part is perpendicular to the scan line, and the extending part is protruded out of the scan line.

17. The liquid crystal display panel according to claim 16, wherein the extending part comprises:
    a first extending part, extending in a first direction perpendicular to the scan line, and protruded out of the scan line; and
    a second extending part, extending in a second direction perpendicular to the scan line, and protruded out of the scan line.

18. The liquid crystal display panel according to claim 13, wherein the semiconductor layer comprises a channel layer and an ohmic contact layer disposed on the channel layer.

* * * * *